US009560596B2

United States Patent
Millard et al.

(10) Patent No.: US 9,560,596 B2
(45) Date of Patent: Jan. 31, 2017

(54) ADAPTIVE BIASING TO MEET STRINGENT HARMONIC REQUIREMENTS

(75) Inventors: Jason Millard, High Point, NC (US); Arthur Nguyen, Kernersville, NC (US)

(73) Assignee: Qorvo US, Inc., Greensboro, NC (US)

( * ) Notice: Subject to any disclaimer, the term of this patent is extended or adjusted under 35 U.S.C. 154(b) by 247 days.

(21) Appl. No.: 13/613,201

(22) Filed: Sep. 13, 2012

(65) Prior Publication Data

US 2013/0064144 A1 Mar. 14, 2013

Related U.S. Application Data

(60) Provisional application No. 61/534,457, filed on Sep. 14, 2011.

(51) Int. Cl.
*H04W 52/02* (2009.01)
*H03F 1/02* (2006.01)
*H03F 1/32* (2006.01)
*H04W 72/04* (2009.01)

(52) U.S. Cl.
CPC ........ *H04W 52/0261* (2013.01); *H03F 1/0261* (2013.01); *H03F 1/32* (2013.01); *H04W 72/0473* (2013.01); *Y02B 60/50* (2013.01)

(58) Field of Classification Search
CPC .................................................. H04W 52/0261
USPC .......................................................... 370/277
See application file for complete search history.

(56) References Cited

U.S. PATENT DOCUMENTS

| 8,159,295 | B2* | 4/2012 | Asbeck ................ H03F 1/0216 330/136 |
| 8,374,282 | B2* | 2/2013 | Szopko .................... H03F 1/30 375/289 |
| 8,380,144 | B1* | 2/2013 | Bai ........................ H03F 1/3247 375/296 |
| 9,093,960 | B2* | 7/2015 | McCallister .......... H03F 1/3247 |
| 2006/0001487 | A1* | 1/2006 | Petrovic et al. .............. 330/149 |
| 2006/0066398 | A1* | 3/2006 | Akamine et al. ............ 330/133 |
| 2007/0021087 | A1* | 1/2007 | Turner .......................... 455/298 |
| 2007/0120606 | A1* | 5/2007 | Lee ....................... H03F 1/0261 330/302 |
| 2009/0052426 | A1* | 2/2009 | Perraud ......................... 370/338 |
| 2009/0310589 | A1* | 12/2009 | Nangia et al. ................. 370/344 |
| 2012/0013400 | A1* | 1/2012 | Chang .................... H03F 1/0233 330/124 R |
| 2012/0064849 | A1* | 3/2012 | Langer et al. ............... 455/127.2 |
| 2012/0099624 | A1* | 4/2012 | Nagaya et al. ............... 375/219 |
| 2012/0249236 | A1* | 10/2012 | Langer et al. ................ 330/127 |
| 2013/0130682 | A1* | 5/2013 | Awad et al. .................. 455/434 |
| 2014/0133526 | A1* | 5/2014 | Camuffo ................ H03F 1/0233 375/219 |
| 2014/0162578 | A1* | 6/2014 | Langer et al. ............. 455/127.2 |
| 2014/0273905 | A1* | 9/2014 | Manku et al. ................ 455/266 |
| 2016/0134243 | A1* | 5/2016 | Luo ......................... H03F 3/193 330/296 |

* cited by examiner

*Primary Examiner* — Hassan Kizou
*Assistant Examiner* — Deepa Belur
(74) *Attorney, Agent, or Firm* — Withrow & Terranova, P.L.L.C.

(57) ABSTRACT

This disclosure relates to adaptively reducing the peak power of harmonic distortions as a function of the operating conditions for transmission communications. Specifically, the bias of the amplifier is adaptively increased to reduce harmonic distortions when a small fraction of the resource blocks are active.

20 Claims, 7 Drawing Sheets

FIG. 1
LTE SIGNAL

| NUMBER OF RB | dB's OF 'HELP' REQUIRED |
|---|---|
| 1 | -8.9 |
| 2 | -8.9 |
| 3 | -8.5 |
| 4 | -7.3 |
| 5 | -6.3 |
| 6 | -5.5 |
| 7 | -4.8 |
| 8 | -4.3 |
| 9 | -3.7 |
| 10 | -3.3 |
| 11 | -2.9 |
| 12 | -2.5 |
| 13 | -2.2 |
| 14 | -1.8 |
| 15 | -1.5 |
| 16 | -1.2 |
| 17 | -1.0 |
| 18 | -0.7 |
| 19 | -0.5 |
| 20 | -0.3 |
| 21 | -0.1 |
| 22 | -0.1 |

FIG. 2
LOOK-UP TABLE

*FIG. 3*
ALGORITHM FLOWCHART

FIG. 4
UNDESIRED HIGH PEAK
HARMONIC POWER (-14.95dBm)

*FIG. 5*
LOW (REDUCED) PEAK HARMONIC
POWER (-25.67dBm)

| 62 | 64 | 66 |
|---|---|---|
| NUMBER OF RB | COLLECTOR VOLTAGE (Vcc) | 8 bit DAC BIAS FOR BASE CURRENT (DEC) |
| 1 | 5.0 | 255 |
| 2 | 4.93 | 245 |
| 3 | 4.86 | 235 |
| 4 | 4.79 | 225 |
| 5 | 4.71 | 215 |
| 6 | 4.64 | 205 |
| 7 | 4.57 | 195 |
| 8 | 4.50 | 185 |
| 9 | 4.42 | 175 |
| 10 | 4.36 | 165 |
| 11 | 4.29 | 155 |
| 12 | 4.21 | 145 |
| 13 | 4.14 | 135 |
| 14 | 4.07 | 125 |
| 15 | 4.00 | 115 |
| 16 | 3.93 | 105 |
| 17 | 3.86 | 95 |
| 18 | 3.79 | 85 |
| 19 | 3.71 | 75 |
| 20 | 3.64 | 65 |
| 21 | 3.57 | 55 |
| 22 | 3.50 | 50 |

*FIG. 6*
ALTERNATE
LOOK-UP TABLE

FIG. 7

ADAPTIVE BIASING TO MEET STRINGENT HARMONIC REQUIREMENTS

RELATED APPLICATIONS

This application claims the benefit of provisional patent application Ser. No. 61/534,457, filed Sep. 14, 2011, the disclosure of which is hereby incorporated herein by reference in its entirety.

FIELD OF THE DISCLOSURE

The field of the disclosure relates to adaptively biasing the amplifier (as a function of the operating conditions) to reduce the peak power of harmonic distortions for transmission communications. Specifically, the bias of the amplifier is adaptively increased to provide more linear operation (and less peak power harmonic distortion) under certain operating conditions, such as when a small fraction of the resource blocks are active. Under other operating conditions, a fixed standard (or default) bias is provided to the amplifier in order to reduce overall power consumption.

BACKGROUND

LTE (Long Term Evolution) modulation and WCDMA (Wideband Code Division Multiple Access) are distinct transmission standards that must both adhere to the same specifications for harmonic distortions, and both are measured in the same bandwidth and have the same limits. In LTE modulation, resource blocks (RBs) may be assigned (activated) to increase the active transmission bandwidth. For example, an LTE channel structure is provided in 3GPP ($3^{rd}$ Generation Partnership Project) standard TS 36.521-1 V2.0.0 (2008-12).

When few resource blocks (less than 22 in one embodiment) are activated in an LTE modulation, then the peak power of the harmonic distortion is undesirably high. This condition may be described as a low activity condition, which has a relatively small number of active resource blocks. This condition may also be described as a low data rate condition.

The conventional solution in industry is to place lossy filters in the transmission path to filter out the undesired harmonic distortions, which occur during low activity conditions. Unfortunately, this conventional solution increases the circuit footprint, increases the circuit cost, and increases the power consumption (thus decreasing the maximum talk time for any battery dependent device). Further, the lossy filters constantly consume power, even though they are really only needed during low activity conditions.

Harmonic distortions may also interfere with GPS (global positioning systems), and prevent GPS from functioning properly.

SUMMARY

The operating conditions of an LTE modulation device may be divided into at least two conditions: a standard condition and a low activity condition.

In the standard condition, many of the resource blocks are active and an amplifier is biased at a standard bias in order to reduce a power consumption of the amplifier. In the low activity condition, few of the resource blocks are active, and the amplifier is biased at an adaptive (non-standard) bias in order to reduce a harmonic distortion of the amplifier.

In one embodiment, the adaptive bias is varied as a function of how many resource blocks are active.

In a second embodiment, the low activity condition is defined as occurring when the LTE active bandwidth is less than the bandwidth of a WCDMA channel.

In one embodiment, a method for adaptively controlling a bias of an amplifier in a communication device comprises: determining whether the device is operating in a low activity condition associated with a high bias, or is operating in a standard condition associated with a standard bias; and upon a determination that the device is operating in the low activity condition, setting the amplifier to the high bias. In this embodiment, the high bias is configured to provide high linearity and low harmonic distortion relative to the standard bias.

Further, determining whether the device is operating in a low activity condition or in a high activity condition may be determined at regular intervals, or may be determined when certain events occur (such as when a command is received which is associated with setting or changing the active bandwidth).

Those skilled in the art will appreciate the scope of the present disclosure and realize additional aspects thereof after reading the following detailed description of the preferred embodiments in association with the accompanying figures.

BRIEF DESCRIPTION OF THE FIGURES

The accompanying figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying figures, those skilled in the art will understand the concepts of the disclosure and will recognize applications of these concepts not particularly addressed herein. It should be understood that these concepts and applications fall within the scope of the disclosure and the accompanying claims.

Figure 1:
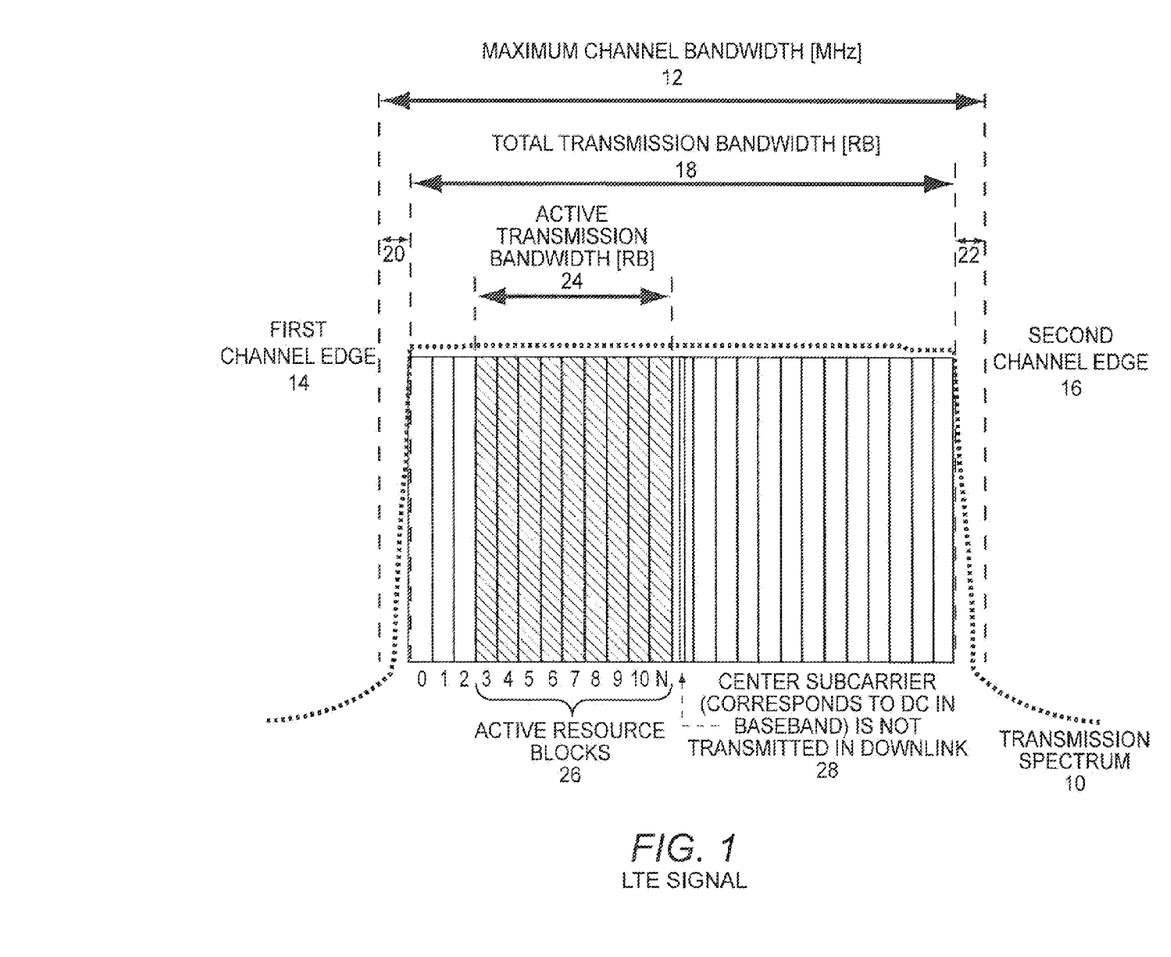
FIG. 1 illustrates an LTE signal including active resource blocks in an active transmission bandwidth portion of a total transmission bandwidth.

FIG. 1 illustrates an LTE signal including active resource blocks. The active resource blocks are located in an active transmission bandwidth portion of a total transmission bandwidth.

In FIG. 1, a transmission spectrum 10 illustrates a possible or allocated transmission spectrum for a communication device. The transmission spectrum 10 has a maximum channel bandwidth 12 defined by a first channel edge 14 and a second channel edge 16. The maximum channel bandwidth includes a first guard band 20 (unused bandwidth), a total transmission bandwidth 18, and a second guard band 22 (unused bandwidth). Within the total transmission bandwidth 18, an active transmission bandwidth 24 illustrates that typically only a portion of the total transmission bandwidth 18 is active at any specific time.

The active transmission bandwidth 24 is often defined by active resource blocks 26, which are a subset of all of the resource blocks of the total transmission bandwidth resource blocks 18. Each individual resource block corresponds to a small portion of the total transmission bandwidth 18. Each resource block (RB) may be, for example, 180 kHz wide.

In FIG. 1, resource blocks 0, 1, and 2 are inactive. In this illustration, consecutive resource blocks 3 through N are active, and comprise the active transmission bandwidth 24. Usually, but not always, the resource blocks are activated beginning with block 0, and additional resource blocks are activated sequentially and consecutively. Consecutive active resource blocks generate more harmonic distortions than non-consecutive active resource blocks. Thus, consecutive active resource blocks are the worst case (most harmonics) and may require a higher adaptive bias than an equivalent number of active resource blocks which are not consecutive. As a conservative measure, the adaptive bias is preferably based on the worst case scenario of consecutive active resource blocks. A slightly more complex calculation may consider the amount of non-consecutiveness, and provide a slightly lower bias for the case of slightly non-consecutive active resource blocks.

In FIG. 1, each RB is 180 kHz wide. The active RBs are consecutive and comprise active resource blocks individually numbered as 3 through N, as shown by active transmission bandwidth 24.

Figure 2:
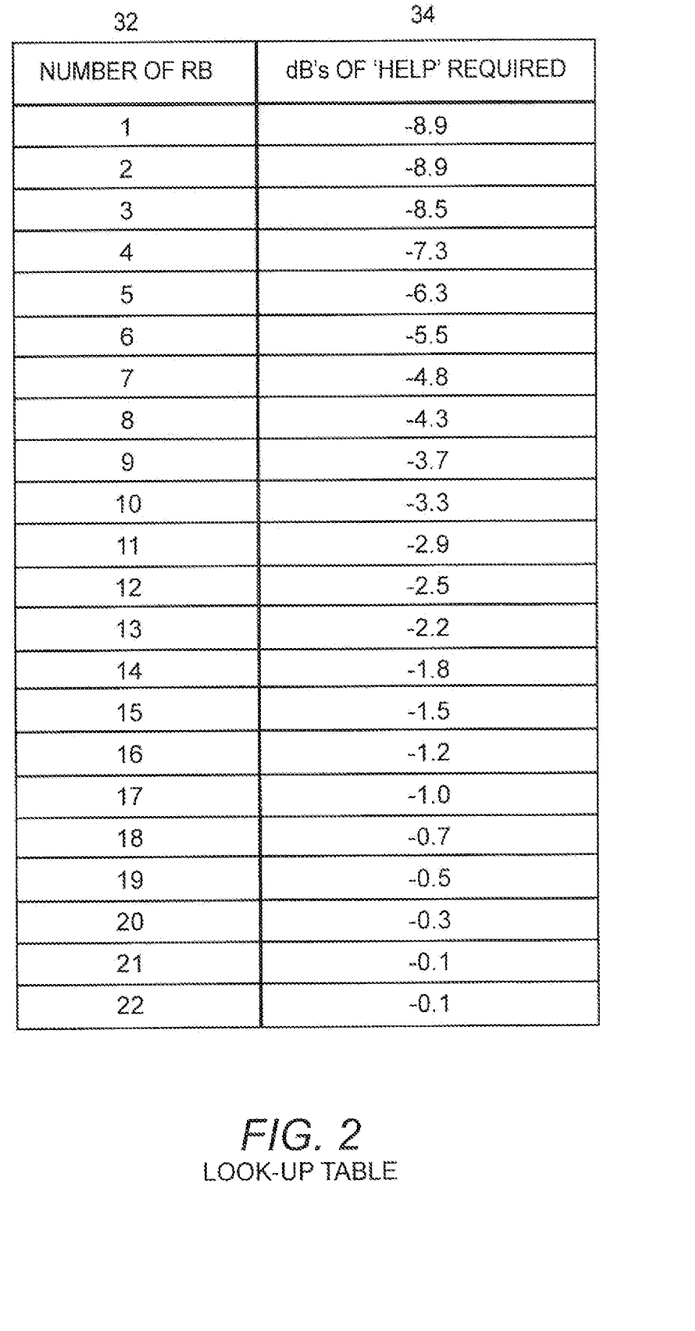
FIG. 2 illustrates a look-up table correlating a number of active RBs (resource blocks) with a value of help required in decibels.

FIG. 2 illustrates a look-up table correlating a number of active RBs with a value of help required in decibels. Column 32 states the number of RBs that are active, and column 34 states the amount of decibels of excess and undesired harmonic noise which occur under a standard bias, and which should be reduced by using an adaptive (non-standard) bias.

In other words, this "help" corresponds to an excessive or undesired harmonic noise which occurs when a small number of RBs are active and the amplifier is operated under the standard bias. Alternatively, the look-up may include a column (not shown) which lists the adaptive (non-standard) bias associated with a specific number of RBs being active.

For example, if only 1 RB is active, then −8.9 decibels of help are required, and the bias of the amplifier must be increased sufficiently to reduce the harmonic noise by 8.9 decibels.

A comparison between an LTE signal and a WCDMA signal highlights the problem. An illustrative WCDMA channel is 3.84 MHz wide, so the second harmonic of this WCDMA channel will be 2×3.84 MHz or 7.68 MHz wide. The harmonic power of this WCDMA channel is said to be spread out. The measurement filter used for harmonics is 1 MHz wide, so any energy outside this filter will not be measured according to industry standards.

The ratio of the measurement bandwidth divided by the second harmonic bandwidth of the signal gives the decrease in the measured power relative the full bandwidth power. In the case of 3G (third generation transmissions standards), this is 1/7.68 or 9 dB lower. Hence, for 3G standards, measuring the harmonics into a 1 MHz filter reduces the harmonic power by 9 dB.

Now consider the case of an LTE signal that is using 1 RB, which would be 0.180 MHz wide. The second harmonic is 0.360 MHz. When this LTE signal is measured using a 1 MHz filter, there is no reduction in power (because the entire signal flows through the filter). Thus, the harmonic distortion of an LTE signal using one active RB appears roughly 9 dB higher than the harmonic distortion of a corresponding WCDMA signal.

The above problem has been addressed in the industry with a brute force method of adding a filter in the LTE path. This filtered LTE path could be shared with 3G, which compounds the problem. Sharing would occur when using a multi-mode power amplifier.

This conventional added filter is always present and will decrease the system efficiency, therefore reducing the maximum talk time of a battery powered device such as a handset. Additionally, the filter also is not free, so it will increase the cost of the BOM (Bill of Materials) and will eat up precious PCB (printed circuit board) space. For a single band, this conventional added filter may be feasible, but for a multiband device it quickly becomes unfeasible to provide multiple conventional added filters.

Clearly the industry brute force solution (added filters) does not scale well into multiband handsets and has negative side effects as discussed above.

In contrast to added filters, the adaptive biasing of the amplifier may utilize a programmable power core in order to meet the stringent harmonic requirements when a small number of RB's are currently active. Adaptive biasing decreases harmonic distortions by increasing the biasing of the amplifier, thus improving the linearity of the amplifier. The adaptive biasing does consume more power relative to standard biasing, however, the adaptive biasing is only used when it is needed (which is rarely). Thus, it is advantageous (overall) to use adaptive biasing when needed, instead of using the conventional brute force added filters which constantly consume power.

Alternatively, FIG. 6 (discussed below) illustrates an alternative look-up table correlating a number of active RBs (resource blocks) with a collector voltage and base bias values.

Figure 3:
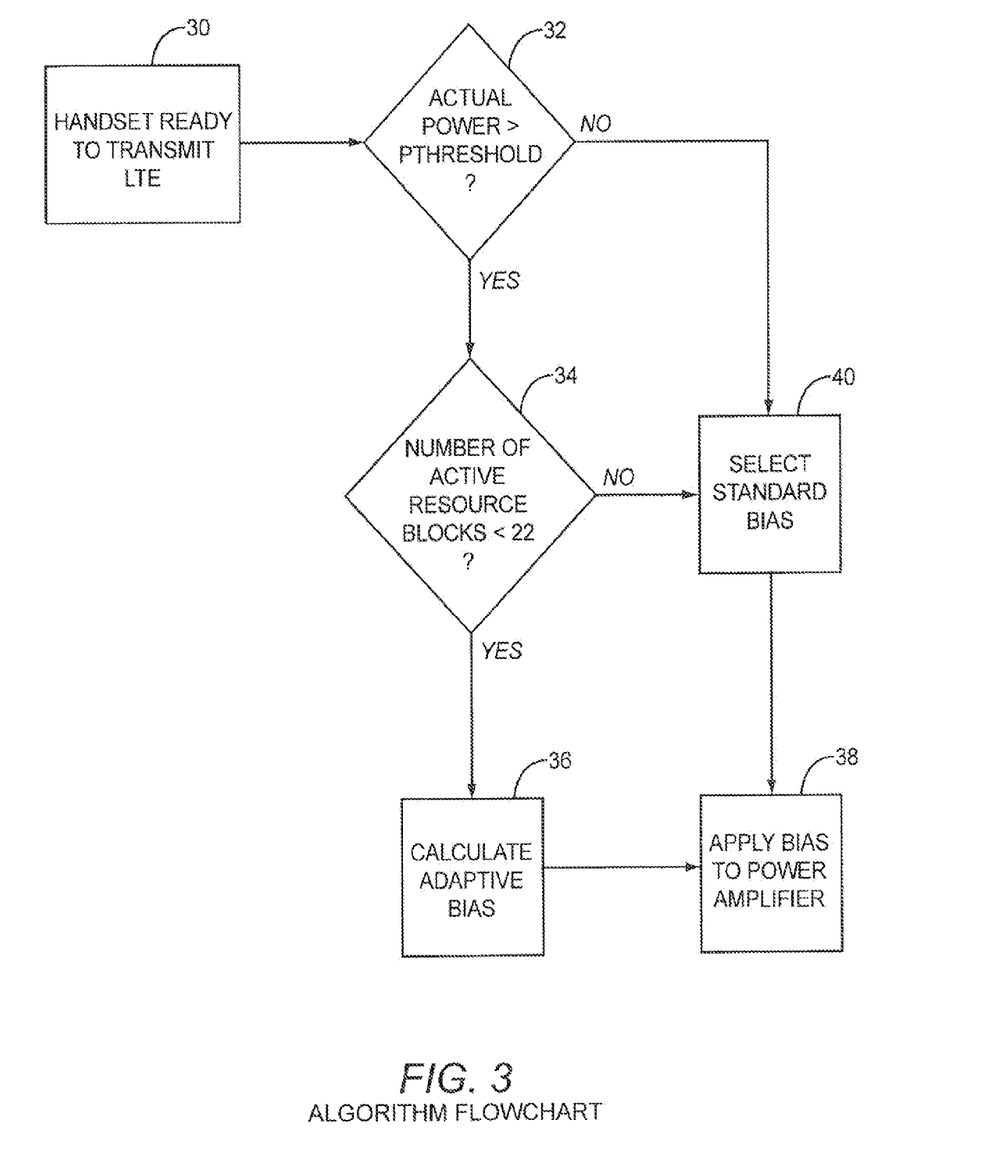
FIG. 3 illustrates an algorithm flowchart for implementing one embodiment of the disclosed invention.

FIG. 3 illustrates an algorithm flowchart for implementing one embodiment of the disclosed invention.

In FIG. 3, optional step 30 illustrates that the handset is ready to transmit an LTE signal. Optional step 32 determines whether an actual power is greater than a threshold power. Optionally, if the actual power is low (not greater than a threshold power) then harmonics will not be a problem and no biasing is needed (even in a low activity condition). Thus, a standard bias may be used under all conditions when the actual power is low.

If the actual power is greater than the threshold power, then step 34 determines whether the device is operating in a low activity condition associated with a high bias (an adaptive bias). In the present example, the low activity condition occurs when the number of active resource blocks is less than 22.

If the number of active resource blocks is less than 22, then step 36 calculates an adaptive bias for amplifier. For example, the look-up table of FIG. 2 may be used to calculate an adaptive bias.

In step 36, the calculation could be performed using a look-up table, or using an equation. In either case, as number of active RB's increases, less and less extra bias will be required.

It is preferable to have a boundary between the low activity condition (associated with a high or adaptive bias) and the standard condition. In one embodiment, this boundary is defined as when the LTE signal bandwidth is greater than or equal to the bandwidth of a WCDMA signal. Since each RB is 180 kHz, we can fit 3.84 MHz/0.180=21.3 RBs into WCDMA channel. RBs are activated in an integral fashion. Thus, as shown in FIG. 2, if 21 or less RBs are active, then a low activity condition exists and adaptive biasing is used. If 22 or more RBs are active, then a standard condition exists and standard biasing is used.

If the actual power is not less than the threshold power (see step 32, arrow exiting to the right), or if the device is not operating in the low activity condition (see step 34, arrow exiting to the right), then step 40 selects a standard bias for the amplifier.

In step 38, either the adaptive bias or the standard bias is applied to the amplifier, depending upon the results of the above described logic.

Figure 4:
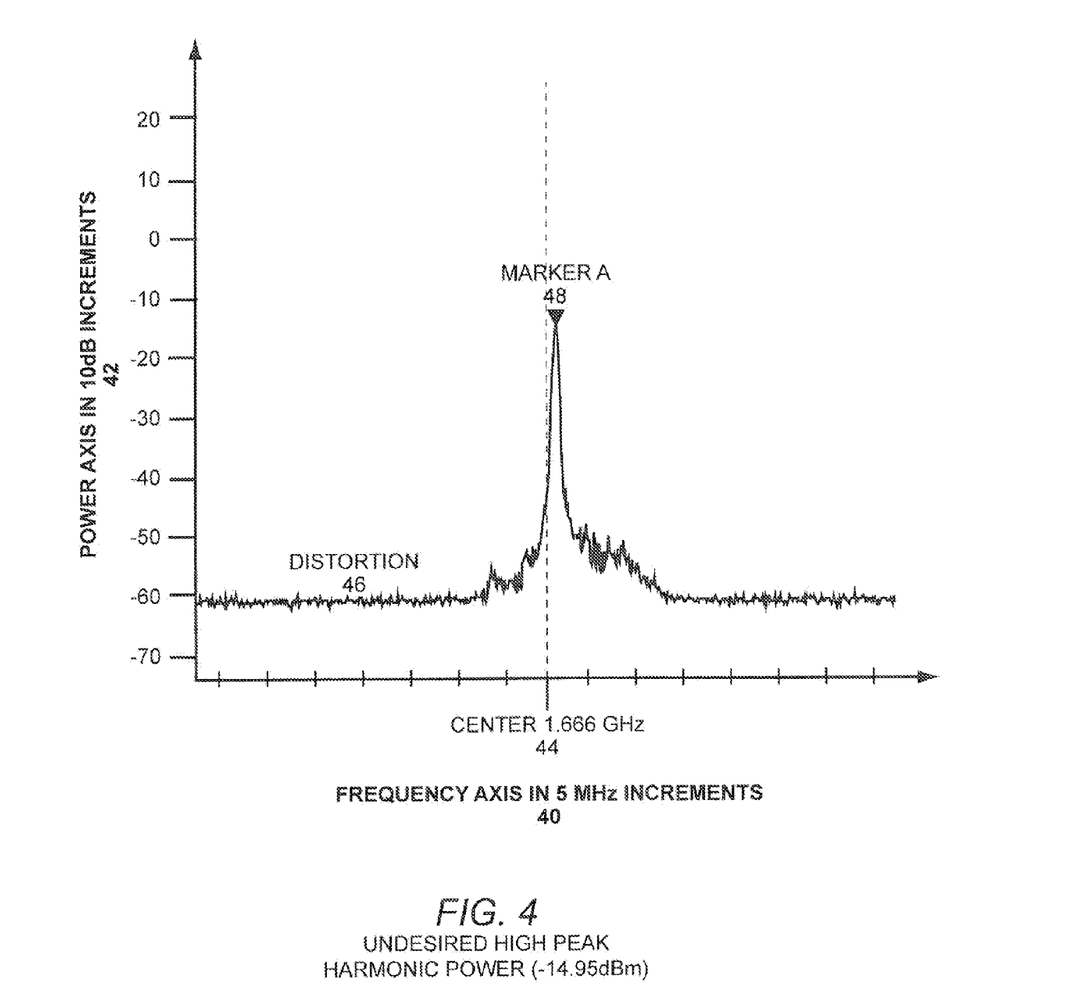
FIG. 4 illustrates an undesired high peak harmonic power when only one resource block is activated and the standard bias is applied to the amplifier.

FIG. 4 provides the results of a spectrum analyzer, and illustrates an undesired high peak harmonic power (−14.95 dBm) when only one resource block is activated, but only the standard bias is applied to the amplifier.

In FIG. 4, horizontal frequency axis 40 is divided into 5 MHz increments about 1.667 GHz center 44. The vertical power axis 42 is divided into 10 dBm increments, with a maximum power of 26.4 dBm and a minimum power of about 70.3 dBm.

The distortion 46 is plotted, and has a peak harmonic power of −14.95 dBm at 1.6677 Ghz (just to the right of the center 44). The peak is labeled by marker A 48.

Additional technical details for this spectrum analyzer include: an attenuation of 10 dB was provided by the spectrum analyzer to condition (attenuate) the distortion signal before analysis; the resolution bandwidth (RBW) for a single RB is 100 kHz; the video bandwidth (VBW) is 1 MHz; the sweeptime (SWT) is 500 ms.

Figure 5:
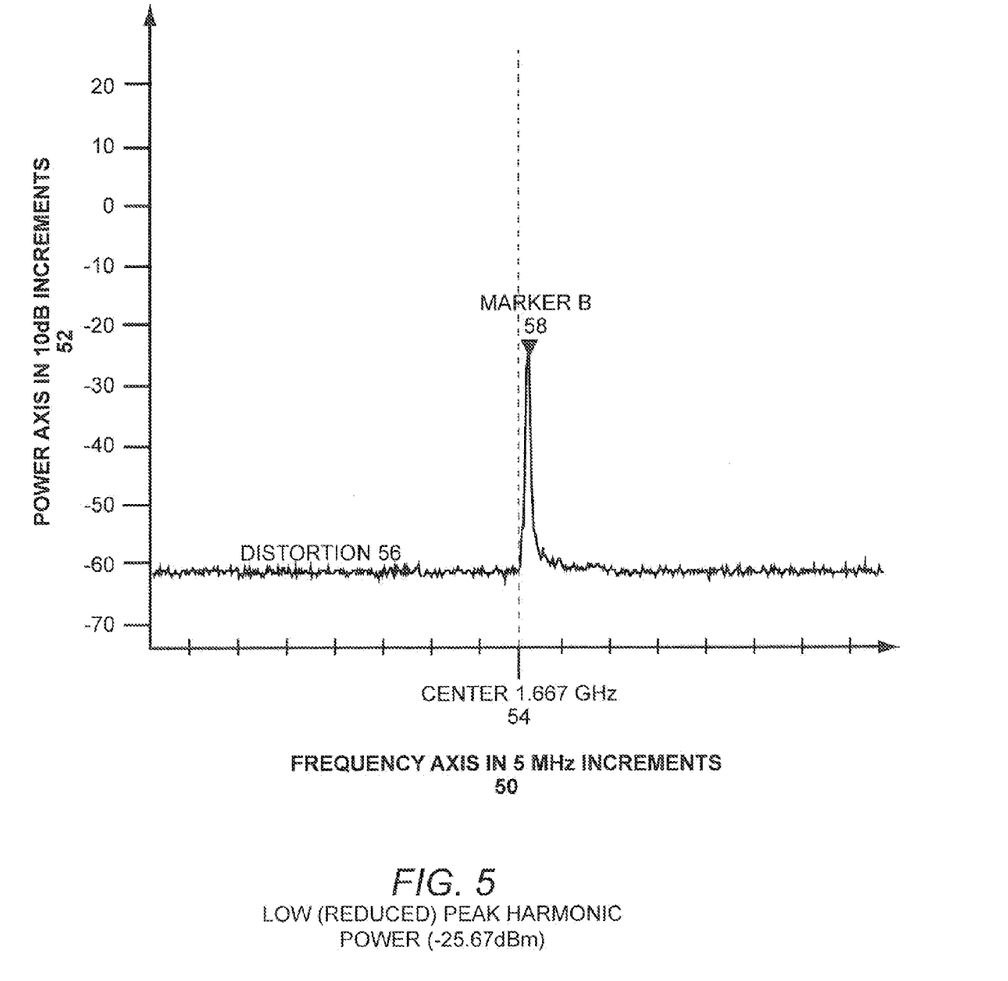
FIG. 5 illustrates a low (reduced) peak harmonic power when one resource block is activated and an adaptive bias is applied to the amplifier.

FIG. 5 illustrates a low (reduced) peak harmonic power (−25.67 dBm) when one resource block is activated and an adaptive bias is applied to the amplifier. FIG. 5 is similar to FIG. 4, except that an adaptive bias has been applied to the amplifier, and this adaptive bias has decreased the peak harmonic power to −25.67 dBm.

In FIG. 5, horizontal frequency axis 50 is divided into 5 MHz increments about 1.667 GHz center 54. The vertical power axis 52 is divided into 10 dBm increments, with a maximum power of 26.4 dBm and a minimum power of about 70.3 dBm.

The distortion 56 is plotted, and has a peak harmonic power of −14.95 dBm at 1.6677 Ghz (just to the right of the center 54). The peak is labeled by marker B 58.

Additional technical details for this spectrum analyzer include: an attenuation of 10 dB was provided by the spectrum analyzer to condition (attenuate) the distortion signal before analysis; the resolution bandwidth (RBW) for a single RB is 100 kHz; the video bandwidth (VBW) is 1 MHz; the sweeptime (SWT) is 500 ms.

Comparing FIGS. 4 and 5, changing from the standard bias of FIG. 4 to the adaptive bias of FIG. 5 changes the peak harmonic power from −14.95 dBm to −25.67. Thus, using the adaptive bias reduces the peak harmonic power by 10.72 dBm, relative to using the standard bias (for one active RB).

Figure 6:
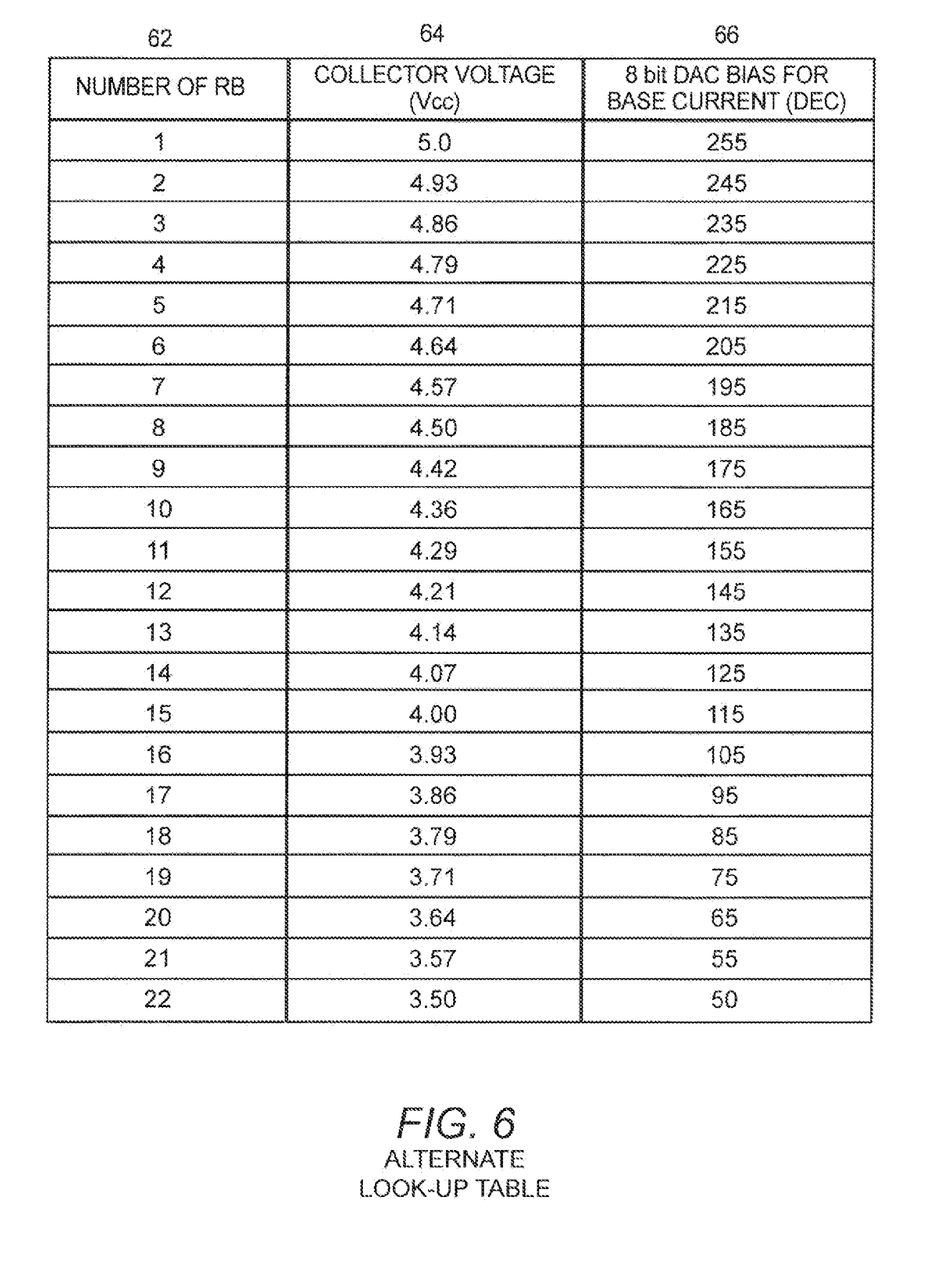
FIG. 6 illustrates an alternative look-up table correlating a number of active RBs (resource blocks) with a collector voltage and base bias values.

FIG. 6 illustrates an alternative look-up table correlating a number of active RBs with a collector voltage (Vcc) and base current bias values.

This look-up table maps from a number of active RBs in column 62 to a collector voltage Vcc in column 64, and the collector voltage may be controlled by an 8 bit command in column 66 to a Digital to Analog Circuit (DAC) bias for a base current.

When 22 RBs are active, the look-up table maps to a normal bias of 3.5V, corresponding to a DAC command of 55. As the number of RBs decreases, the bias (and linearity) will increase by increasing the Collector Voltage (Vcc) 64 and increasing the DAC command. When more than 22 RBs are active, the normal bias of 3.5V is maintained.

When 1 RB is active (minimum number of active RBs), the look up table maps to a high Collector Voltage Vcc of 5.0V, corresponding to a maximum 8 bit DAC command of 255.

Figure 7:
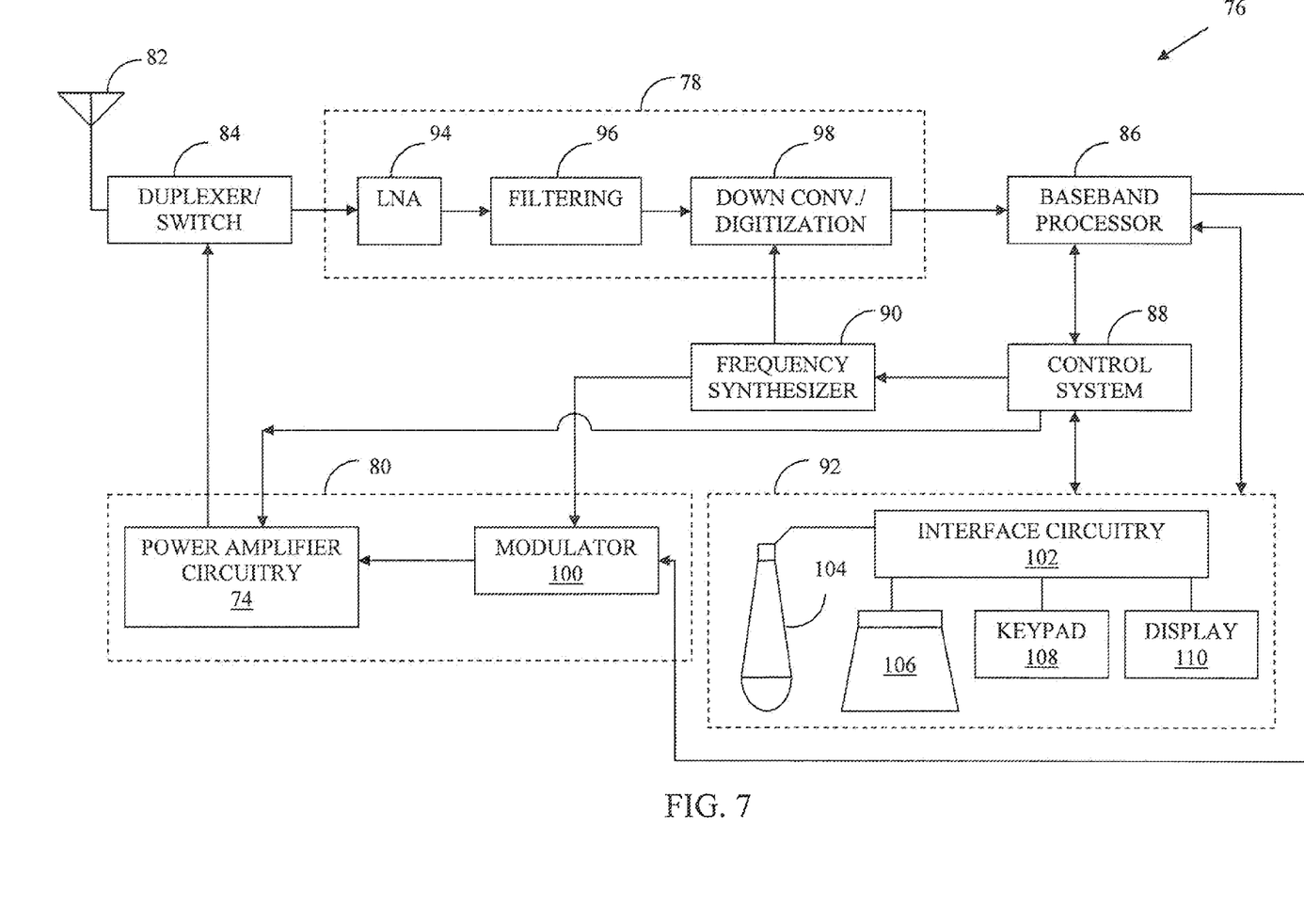
FIG. 7 illustrates a mobile terminal including power amplifier adaptive bias circuitry.

FIG. 7 illustrates an exemplary mobile terminal including power amplifier adaptive bias circuitry.

Specifically, FIG. 7 illustrates an exemplary basic architecture for a mobile terminal 76, wherein amplifier adaptive bias circuitry 112 adaptively changes the bias of at least one power amplifier in the power amplifier circuitry 74 of the mobile terminal 76.

The mobile terminal 76 may include a receiver front end 78, a radio frequency transmitter section 80, an antenna 82, a duplexer or switch 84, a baseband processor 86, a control system 88, a frequency synthesizer 90, and an interface 92. The receiver front end 78 receives information bearing radio frequency signals from one or more remote transmitters provided by a base station (not shown). A low noise amplifier (LNA) 94 amplifies a recieved signal. A filter circuit 96 minimizes broadband interference in the received signal, while down conversion and digitization circuitry 98 down converts the filtered, received signal to an intermediate or baseband frequency signal, which is then digitized into one or more digital streams. The receiver front end 78 typically uses one or more mixing frequencies generated by the frequency synthesizer 90. The baseband processor 86 processes the digitized received signal to extract the information or data bits conveyed in the received signal. This processing typically comprises demodulation, decoding, and error correction operations. As such, the baseband processor 86 is generally implemented in one or more digital signal processors (DSPs).

On the transmit side, the baseband processor 86 receives digitized data, which may represent voice, data, or control information, from the control system 88, which it encodes for transmission. The encoded data is output to the transmitter 80, where it is used by a modulator 100 to modulate a carrier signal that is at a desired transmit frequency. The power amplifier circuitry 74 amplifies the modulated carrier signal to a level appropriate for transmission, and delivers the amplified and modulated carrier signal to the antenna 82 through the duplexer or switch 84.

The control system 88 may also adjust the bias of the power amplifier circuitry 74. Power amplifier circuitry 74 may include power amplifier adaptive bias circuitry (not shown).

A user may interact with the mobile terminal 76 via the interface 92, which may include interface circuitry 102 associated with a microphone 104, a speaker 106, a keypad 108, and a display 110. The interface circuitry 102 typically includes analog-to-digital converters, digital-to-analog converters, amplifiers, and the like. Additionally, it may include a voice encoder/decoder, in which case it may communicate directly with the baseband processor 86. The microphone 104 will typically convert audio input, such as the user's voice, into an electrical signal, which is then digitized and passed directly or indirectly to the baseband processor 86. Audio information encoded in the received signal is recovered by the baseband processor 86, and converted by the interface circuitry 102 into an analog signal suitable for driving the speaker 106. The keypad 108 and display 110 enable the user to interact with the mobile terminal 76, input numbers to be dialed, address book information, or the like, as well as monitor call progress information.

Those skilled in the art will recognize improvements and modifications to the preferred embodiments of the present disclosure. All such improvements and modifications are considered within the scope of the concepts disclosed herein and the claims that follow.

What is claimed is:

1. A method for adaptively controlling a bias of a power amplifier configured to amplify radio frequency (RF) transmit signals in a communication device, the method comprising:
    determining whether the communication device is operating in a low activity condition based on an active transmission bandwidth of the communication device, wherein the low activity condition indicates that the active transmission bandwidth of the communication device is below a predetermined threshold; and
    upon a determination that the communication device is operating in the low activity condition, calculating a desired amount of harmonic distortion attenuation based on a number of active resource blocks utilized by the communication device, and setting the bias of the power amplifier based on the desired amount of harmonic distortion attenuation.

2. The method of claim 1, wherein the low activity condition occurs when the active transmission bandwidth of the communication device is less than a WCDMA (wideband code division multiple access) channel bandwidth.

3. The method of claim 1, wherein a first bias for a narrow active transmission bandwidth is greater than a second bias for a wider active transmission bandwidth.

4. The method of claim 3, wherein the active transmission bandwidth of the communication device includes at least one active resource block.

5. The method of claim 4, wherein calculating the desired amount of harmonic distortion attenuation comprises calculating a number of decibels of harmonic distortion attenuation required.

6. The method of claim 5, wherein calculating the desired amount of harmonic distortion attenuation comprises using a look-up table mapping the number of active resource blocks to an associated number of decibels of harmonic distortion attenuation required.

7. The method of claim 4, wherein calculating the desired amount of harmonic distortion attenuation comprises calculating a collector voltage required as a function of how many resource blocks are active.

8. The method of claim 7, wherein calculating the desired amount of harmonic distortion attenuation comprises using a look-up table mapping the number of active resource blocks to an associated collector voltage.

9. The method of claim 4, wherein calculating the desired amount of harmonic distortion attenuation comprises considering specific locations of the active resource blocks, such that a number of sequential active resource blocks requires a higher bias than a same number of non-sequential active resource blocks.

10. The method of claim 4, wherein all active resource blocks are less than a center subcarrier.

11. The method of claim 1, further comprising:
    determining whether an actual power is above a threshold power before determining whether the communication device is operating in the low activity condition; and
    upon the determination that the actual power is above the threshold power, then determining whether the communication device is operating in the low activity condition.

12. An apparatus comprising:
    a control portion configured to adaptively control a bias of a power amplifier configured to amplify radio frequency (RF) transmit signals in a communication device,
    wherein the apparatus is configured to:
        determine whether a communication device is operating in a low activity condition based on an active transmission bandwidth of the communication device, wherein the low activity condition indicates that the active transmission bandwidth of the communication device is below a predetermined threshold; and
        upon the determination that the communication device is operating in the low activity condition, calculate a desired amount of harmonic distortion attenuation based on a number of active resource blocks utilized by the communication device, and set the bias of the power amplifier based on the desired amount of harmonic distortion attenuation.

13. The apparatus of claim 12, wherein the low activity condition occurs when the active transmission bandwidth of the communication device is less than a WCDMA (wideband code division multiple access) channel bandwidth.

14. The apparatus of claim 12, wherein
    a first bias for a narrow active transmission bandwidth is greater than a second bias for a wider active transmission bandwidth.

15. The apparatus of claim 14, wherein the active transmission bandwidth of the communication device includes at least one active resource block.

16. The apparatus of claim 15, wherein calculating the desired amount of harmonic distortion attenuation comprises calculating a collector voltage required as a function of how many resource blocks are active.

17. The apparatus of claim 15, wherein calculating the desired amount of harmonic distortion attenuation comprises considering specific locations of the active resource blocks, such that a number of sequential active resource blocks requires a higher bias than a same number of non-sequential active resource blocks.

18. The apparatus of claim 15, wherein all active resource blocks are less than a center subcarrier.

19. The apparatus of claim 15, wherein the control portion is further configured to:
    determine whether an actual power is above a threshold power before determining whether the communication device is operating in the low activity condition; and
    upon a determination that the actual power is above the threshold power, then determine whether the communication device is operating in the low activity condition.

20. A mobile terminal comprising:
    an antenna;

a duplexer/switch coupled to the antenna;
a receiver front end coupled to the duplexer/switch;
a baseband processor coupled to the receiver front end;
a control system coupled to the baseband processor;
a frequency synthesizer coupled to the control system;
a modulator coupled to the baseband processor and the frequency synthesizer; and
power amplifier circuitry coupled to the control system and the duplexer/switch and configured to amplify radio frequency (RF) transmit signals provided from the modulator for transmission from the antenna,
wherein the control system is configured to:
   determine whether the mobile terminal is operating in a low activity condition based on an active transmission bandwidth of the mobile terminal, wherein the low activity condition indicates that the active transmission bandwidth of the communication device is below a predetermined threshold; and
   upon determining that the mobile terminal is operating in the low activity condition, calculate a desired amount of harmonic distortion attenuation based on a number of active resource blocks utilized by the mobile terminal and set a bias of at least one power amplifier in the power amplifier circuitry based on the desired amount of harmonic distortion attenuation.

* * * * *

UNITED STATES PATENT AND TRADEMARK OFFICE
CERTIFICATE OF CORRECTION

| | |
|---|---|
| PATENT NO. | : 9,560,596 B2 |
| APPLICATION NO. | : 13/613201 |
| DATED | : January 31, 2017 |
| INVENTOR(S) | : Jason Millard et al. |

Page 1 of 1

It is certified that error appears in the above-identified patent and that said Letters Patent is hereby corrected as shown below:

In the Claims

In Column 7, Lines 50-51, Claim 5; replace "harmonic distortion attenuation required." with --harmonic distortion attenuation.--.

Signed and Sealed this
Sixth Day of June, 2017

Michelle K. Lee
*Director of the United States Patent and Trademark Office*